United States Patent
Kim et al.

(10) Patent No.: US 11,616,106 B2
(45) Date of Patent: Mar. 28, 2023

(54) DISPLAY DEVICE REQUIRING REDUCED MANUFACTURING STEPS

(71) Applicant: Samsung Display Co., LTD., Yongin-si (KR)

(72) Inventors: Hyun Kim, Seoul (KR); Seung Hwan Cho, Yongin-si (KR); Ju Chan Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 19 days.

(21) Appl. No.: 16/834,493

(22) Filed: Mar. 30, 2020

(65) Prior Publication Data
US 2020/0312932 A1 Oct. 1, 2020

(30) Foreign Application Priority Data
Mar. 28, 2019 (KR) .................. 10-2019-0035734

(51) Int. Cl.
*H01L 27/32* (2006.01)
(52) U.S. Cl.
CPC ...... *H01L 27/3248* (2013.01); *H01L 27/3258* (2013.01); *H01L 2227/323* (2013.01)
(58) Field of Classification Search
CPC ............. H01L 27/3248; H01L 27/3258; H01L 2227/323
USPC ........................................................ 257/72
See application file for complete search history.

(56) References Cited

U.S. PATENT DOCUMENTS

| | | | |
|---|---|---|---|
| 9,430,180 B2 | 8/2016 | Hirakata et al. | |
| 9,535,522 B2 | 1/2017 | Ahn | |
| 2001/0043046 A1 | 11/2001 | Fukunaga | |
| 2003/0080436 A1 | 5/2003 | Ishikawa | |
| 2012/0162053 A1* | 6/2012 | Lee | H01L 27/3279 345/80 |
| 2014/0353607 A1* | 12/2014 | Kim | H01L 27/3248 257/40 |

(Continued)

FOREIGN PATENT DOCUMENTS

| | | |
|---|---|---|
| KR | 10-2016-0008063 | 1/2016 |
| KR | 10-2017-0117274 | 10/2017 |
| KR | 10-1889748 | 8/2018 |

OTHER PUBLICATIONS

Extended European Search Report corresponding to European Application or Patent No. 20165981.0 dated Aug. 17, 2020.

*Primary Examiner* — Xia L Cross
(74) *Attorney, Agent, or Firm* — Kile Park Reed & Houtteman PLLC

(57) ABSTRACT

A display device is provided that includes a substrate, a first conductive layer disposed on the substrate, a first insulating layer disposed on the first conductive layer, a second insulating layer disposed on the first insulating layer, the second insulating layer including a contact hole exposing the first conductive layer, a second conductive layer disposed on the first insulating layer and electrically connected to the first conductive layer through the contact hole, a second insulating layer disposed on the first insulating layer, a first electrode disposed on the second insulating layer and the second conductive layer, the first electrode being electrically connected to the second conductive layer, a light emitting layer disposed on the first electrode, and a second electrode disposed on the light emitting layer.

26 Claims, 12 Drawing Sheets

(56) References Cited

U.S. PATENT DOCUMENTS

| | | | |
|---|---|---|---|
| 2015/0362805 A1* | 12/2015 | Nakagawa | G02F 1/136227 |
| | | | 257/71 |
| 2017/0179097 A1 | 6/2017 | Zhang et al. | |
| 2018/0130856 A1* | 5/2018 | Kim | H01L 27/3218 |
| 2019/0027687 A1* | 1/2019 | Moon | C23C 14/12 |
| 2020/0411617 A1* | 12/2020 | Kishimoto | H01L 27/3262 |
| 2021/0043657 A1* | 2/2021 | Song | H01L 29/41733 |

* cited by examiner

105: 105_1, 105_2
110: 110_1, 110_2
120: 121
130: 131, 132, 133, 134, 134, 135, 136
140: 141
150: 151
160: 161

105: 105_1, 105_2
110: 110_1, 110_2
120: 121
130: 131, 132, 133, 134, 134, 135, 136
140: 141, 145
150: 151
160: 161
180: 181

105: 105_1, 105_2
110: 110_1, 110_2
120: 121
130: 131, 132, 133, 134, 134, 135, 136
140: 141, 145
150: 151
160: 161
180: 181'

105: 105_1, 105_2
110: 110_1, 110_2
120: 121
130: 131, 132, 133, 134, 134, 135, 136
140: 141
150: 151
160: 161

DISPLAY DEVICE REQUIRING REDUCED MANUFACTURING STEPS

CROSS-REFERENCE TO RELATED APPLICATION

This application claims priority from Korean Patent Application No. 10-2019-0035734 under 35 U.S.C. § 119, filed on Mar. 28, 2019 in the Korean Intellectual Property Office, the entire contents of which are herein incorporated by reference.

BACKGROUND

1. Technical Field

The disclosure relates to a display device, and more specifically, to a construction therefor that minimizes overall thickness and enhances image resolution.

2. Description of the Related Art

Usage of various types of display devices, such as a liquid crystal display (LCD) device, and an organic light emitting diode (OLED) display device has become increasingly important with the widespread development of multimedia.

The OLED display device displays an image by using the OLED to generate light by variously configuring the image in accordance with a recombination of electrons and holes throughout a display area of the display device. Advantages of the OLED display device include fast response speed, high luminance and a large viewing angle, and low power consumption.

Thus far, resolution of some of the above-described display devices has included 4k Ultra High Definition (UHD), while 8K Ultra High Definition (8K UHD) is under development. UHD refers to a resolution of 3,840×2,160 pixels, and 8K UHD refers to a resolution of 7,680×4,320 pixels.

SUMMARY

Aspects of the disclosure provide a display device capable of realizing a high-resolution OLED display device in accordance with principles of the above-discussed UHD that minimizes a thickness of the display device and does so while maximizing the efficiency of manufacturing the same.

According to an embodiment of the disclosure, a display device may include a substrate, a first conductive layer disposed on the substrate, a first insulating layer disposed on the first conductive layer, a second insulating layer disposed on the first insulating layer, the second insulating layer including a contact hole exposing the first conductive layer, a second conductive layer disposed on the first insulating layer and electrically connected to the first conductive layer through the contact hole, a second insulating layer disposed on the first insulating layer, a first electrode disposed on the second insulating layer and the second conductive layer, the first electrode being electrically connected to the second conductive layer, a light emitting layer disposed on the first electrode, and a second electrode disposed on the light emitting layer, wherein an average distance between an upper surface of the second conductive layer and a surface of the substrate may be substantially equal to an average distance between an upper surface of the second insulating layer and the surface of the substrate.

The upper surface of the second insulating layer may extend from the upper surface of the second conductive layer in a thickness direction.

The second insulating layer may be disposed around the second conductive layer, and a sidewall of the second conductive layer may contact a sidewall of the second insulating layer.

An angle between the sidewall of the second conductive layer and the upper surface of the second insulating layer may be an acute angle, and an angle between the sidewall of the second insulating layer and the upper surface of the second insulating layer may be an obtuse angle.

The first electrode and the second conductive layer may be in direct contact with each other.

The first electrode may have a uniform thickness.

The display device may further comprise a semiconductor layer disposed between the substrate and the first conductive layer, wherein the first conductive layer may include a first source electrode electrically connected to the semiconductor layer.

The display device may further comprise a pixel defining layer disposed on the second insulating layer and the first electrode, the pixel defining layer including an opening exposing the first electrode.

The opening may be disposed to overlap a region where the first electrode and the second conductive layer are electrically with each.

The second insulating layer may include an organic insulating material.

A thickness of the second conductive layer may be the same as a thickness of the second insulating layer.

A thickness of the second insulating layer may be smaller than a thickness of the first insulating layer.

A surface roughness of the upper surface of the second insulating layer may be larger than a surface roughness of an upper surface of the first insulating layer.

The substrate may include a display area and a non-display area,

The display device may further comprise a plurality of data lines disposed over the display area and the non-display area and a plurality of connection lines disposed in the display area, the plurality of connection lines being respectively connected to the plurality of data lines.

The display device may further comprise a third conductive layer disposed with the first conductive layer and the second conductive layer, wherein the second conductive layer may include the connection lines, and the first conductive layer may include the data lines.

The display device may further comprise a third insulating layer disposed between the third conductive layer and the second insulating layer, wherein an average distance between an upper surface of the third conductive layer and the surface of the substrate is substantially equal to an average distance between an upper surface of the third insulating layer and the surface of the substrate.

The third insulating layer may include an organic insulating material.

The second conductive layer and the third conductive layer may be in direct contact with each other.

The second conductive layer may have a uniform thickness.

The first conductive layer, the second conductive layer and the third conductive layer may overlap each other in plan view.

According to an embodiment of the disclosure, high-resolution of a display device may be achieved while reducing a thickness thereof. In doing so, a number of masks ordinarily used to provide for contact holes enabling connections within the display device may be reduced, thereby reducing a cost and a complexity of the manufacturing process of the display device.

The effects of the present disclosure are not limited to the above-described effects and other effects which are not described herein will become apparent to those skilled in the art from the following description.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
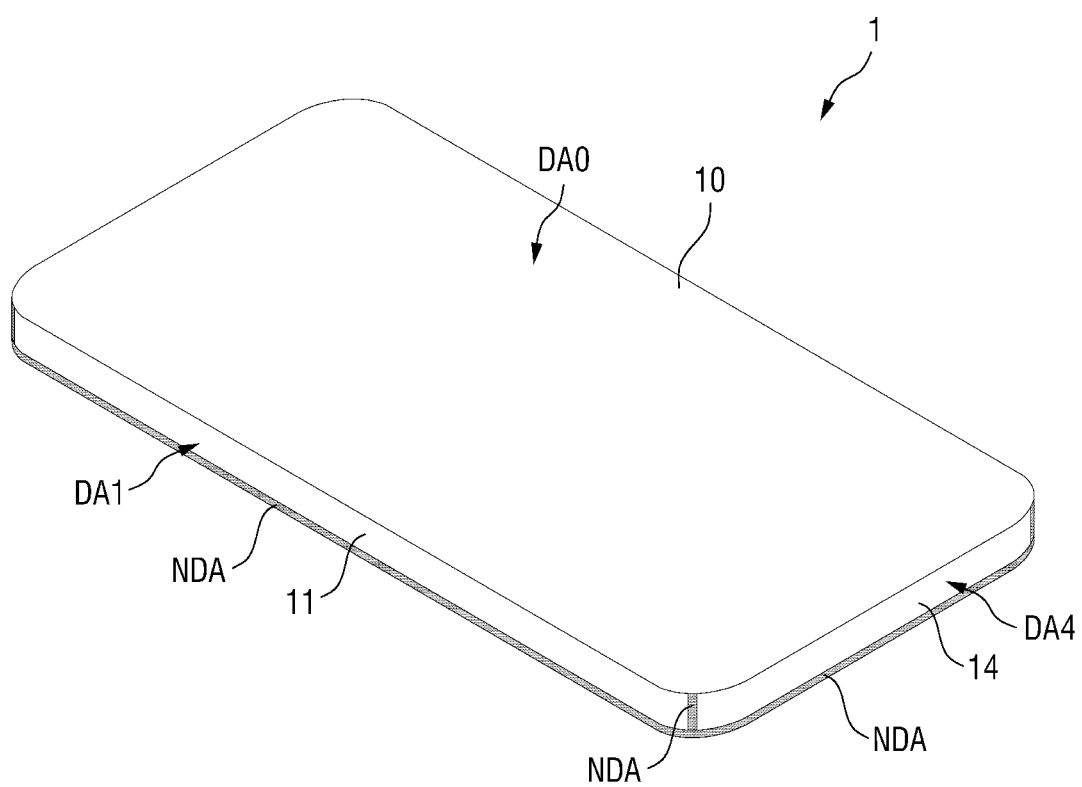
FIG. 1 is a perspective view of a display device according to an embodiment.

Aspects of the embodiments will now be described more fully hereinafter with reference to the accompanying drawings. Although aspects of the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

Some of the parts which are not associated with the description may not be provided in order to describe various embodiments and like reference numerals refer to like elements throughout the specification.

Further, in the specification, the phrase "in a plan view" means when an object portion is viewed from above, and the phrase "in a schematic cross-sectional view" means when a cross-section taken by vertically cutting an object portion is viewed from the side. Additionally, the terms "overlap" or "overlapped" mean that a first object may be above or below or to a side of a second object, and vice versa.

When a layer, region, substrate, or area, is referred to as being "on" another layer, region, substrate, or area, it may be directly on the other film, region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof. As used herein, the term "and/or" includes any and all combinations of one or more of the associated listed items.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
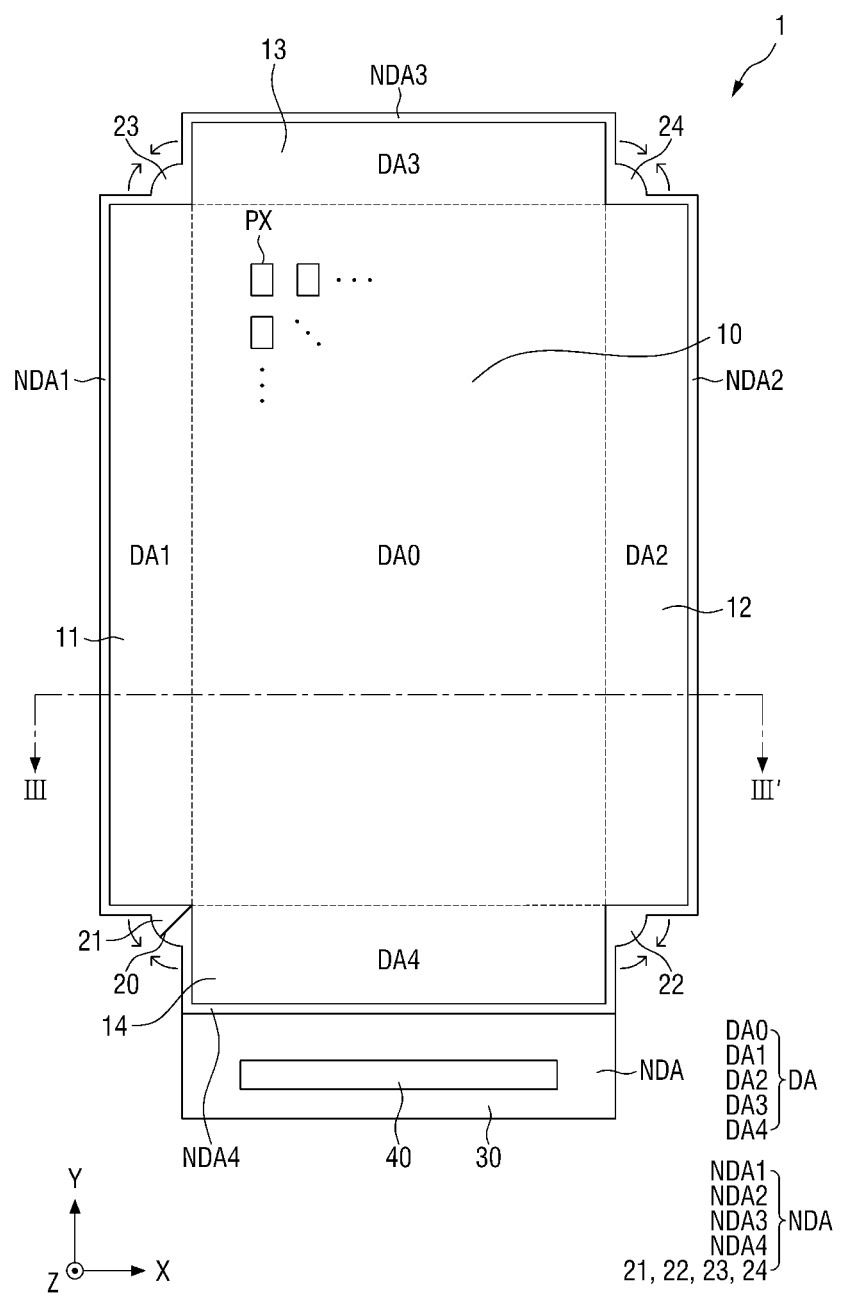
FIG. 2 is a plan view showing a manufacturing state of the display device of FIG. 1.

FIG. 1 is a perspective view of a display device according to an embodiment. FIG. 2 is a plan view showing a manufacturing state of the display device of FIG. 1.

Referring to FIGS. 1 and 2, the display device 1 may display an image. For example, the display device 1 may be an organic light emitting display (OLED), a liquid crystal display (LCD), a plasma display (PDP), a field emission display (FED), an electrophoretic display (EPD) or the like. Hereinafter, an organic light emitting diode (OLED) display device as the display device 1 will be described as an example, but the disclosure is not limited thereto.

The display device 1 may be applied to various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

The display device 1 may include a main display surface 10 and sub-display surfaces 11 to 14.

The main display surface 10 may have a substantially planar shape and may be located on one plane of the display device 1. The main display surface 10 may have the largest area (or size) among the main display surface 10 and the sub-display surfaces 11 to 14. For example, the main display surface 10 may be located on an upper surface of the display device 1. The main display surface 10 may have a planar shape such as a polygonal shape such as a rectangular shape, a circular shape or an elliptical shape.

The sub-display surfaces 11 to 14 may be disposed on a plane different from the plane where the main display surface 10 is disposed. Each of the sub-display surfaces 11 to 14 may have an area smaller than the area of the main display surface 10, and the sub-display surfaces 11 to 14 may be disposed on different planes. The sub-display surfaces 11 to 14 may be connected to the sides of the main display surface 10, respectively, and may be bent from the main display surface 10 (or from the sides of the main display surface 10).

For example, when the main display surface 10 has a rectangular shape, the display device 1 includes first to fourth sub-display surfaces 11 to 14, and the first to fourth sub-display surfaces 11 to 14 may be connected to the four sides of the rectangle, respectively.

The first sub-display surface 11 may be connected to a first long side of the main display surface 10, and may be bent in a vertical direction from the main display surface 10 to constitute a left side surface of the display device 1. Similarly, the second sub-display surface 12 may be connected to a second long side of the main display surface 10, and may be bent in the vertical direction from the main display surface 10 to form a right side surface of the display device 1. The third sub-display surface 13 may be connected to a first short side of the main display surface 10 to form an upper side surface of the display device 1, and the fourth sub-display surface 14 may be connected to a second short side of the main display surface 10 to form a lower side surface of the display device 1.

The display device 1 may be a three-dimensional multi-surface display device that displays a screen on an upper surface and side surfaces of the display device 1. Although FIG. 2 illustrates that a lower surface of the display device 1 does not include a display surface, this is merely exemplary, and the disclosure is not limited thereto. For example, the display device 1 may further include a lower surface which displays an image.

The display device 1 may include a display area DA and a non-display area NDA. The display area is an area which displays an image, and may include a pixel PX which is a light emitting unit for displaying an image. The non-display area is an area which does not display an image, and may not include the pixel PX. The pixel PX will be described later with reference to FIG. 3.

The display area DA may include a main display area DA0 and first to fourth sub-display areas DA1 to DA4.

The main display area DA0 may be disposed on the main display surface 10. For example, the main display surface 10 may include only the main display area DA0. The first sub-display area DA1 may be disposed on the first sub-display surface 11, and the first sub-display area DA1 may be connected to the main display area DA0. Similarly, the second to fourth sub-display areas DA2 to DA4 are respectively disposed on the second to fourth sub-display surfaces 12 to 14, and each of the second to fourth sub-display areas DA2 to DA4 may be connected to the main display area DA0.

The non-display area NDA may be disposed along the edge of the display area DA (or the outermost edge of the main display surface 10 and the sub-display surfaces 11 to 14). A driving wiring, a driving circuit, and the like may be disposed in the non-display area NDA. The non-display area NDA may include, but is not limited to, a black matrix for blocking light leakage, decoration ink, and the like.

The non-display area NDA may include first to fourth non-display areas NDA1 to NDA4 (or first to fourth sub-non-display areas). The first non-display area NDA1 may be located on the first sub-display surface 11. Similarly, the second to fourth non-display areas NDA2 to NDA4 may be disposed on the second to fourth sub-display surfaces 12 to 14, respectively.

The non-display area NDA (or display device 1) may include first to fourth corner wings 21 to 24 (i.e., corner portions, corner regions, corner wing regions). Each of the first to fourth corner wings 21 to 24 may be disposed adjacent to a corner (i.e., a portion where two sides meet) of the main display surface 10. The first to fourth corner wings 21 to 24 may be substantially identical to each other except for their positions. Hereinafter, common features of the first to fourth corner wings 21 to 24 will be described with reference to the first corner wing 21.

The first corner wing 21 may provide a space for passing or arranging data lines. When the first sub-display surface 11 and the fourth sub-display surface 14 are bent, the first corner wing 21 may be folded inward (i.e., in a direction toward the center of gravity of the display device 1). For example, the first corner wing 21 may be folded along a folding line 20 such that one end (i.e., a first portion adjacent to the first sub-display surface 11) of the first corner wing 21 and the other end (i.e., a second portion adjacent to the fourth sub-display surface 14) of the first corner wing 21 may face each other. One end and the other end of the first corner wing 21 may be in contact with each other or may be coupled through a coupling layer or the like.

Since the first corner wing 21 is folded inward when folding the first sub-display surface 11 and the fourth sub-display surface 14, the first corner wing 21 may not be exposed to the outside. Similarly, the second corner wing 22, the third corner wing 23 and the fourth corner wing 24 may not be exposed to the outside. Accordingly, the first to fourth corner wings 21 to 24 may be included in the non-display area NDA.

The non-display area NDA may further include a driving area 30, and the driving area 30 may be connected to at least one of the first to fourth sub-display surfaces 11 to 14. For example, the driving area 30 may be connected to one side of the fourth sub-display surface 14 (e.g., the lower side of the fourth sub-display surface 14).

As shown in FIG. 1, when the fourth sub-display surface 14 is bent vertically with respect to the main display surface 10, the driving area 30 may be further bent with respect to the fourth sub-display surface 14 (i.e., bent at an angle of 180° with respect to the main display surface 10), and disposed below the main display surface 10 in a thickness direction of the main display surface 10. The driving area 30 may overlap the main display surface 10 and be parallel to the main display surface 10.

The display device 1 may include a driving chip 40 (or a pad portion in which a driving chip is disposed and electrically connected to the driving chip), and the driving chip 40 may be disposed in the driving area 30. The driving chip 40 may generate a driving signal necessary for driving the pixel PX and provide it to the display area DA (or the pixel PX). For example, the driving chip 40 may generate a data signal that determines the light emission luminance of the pixel PX. For example, the driving chip 40 may provide the data signal to the pixel PX through a driving wiring formed in the driving area and a data wiring formed on the main display surface 10 and one or more of the sub-display surfaces 11 to 14, as described later.

Hereinafter, a configuration of the pixel of the display device will be described in detail.

Figure 3:
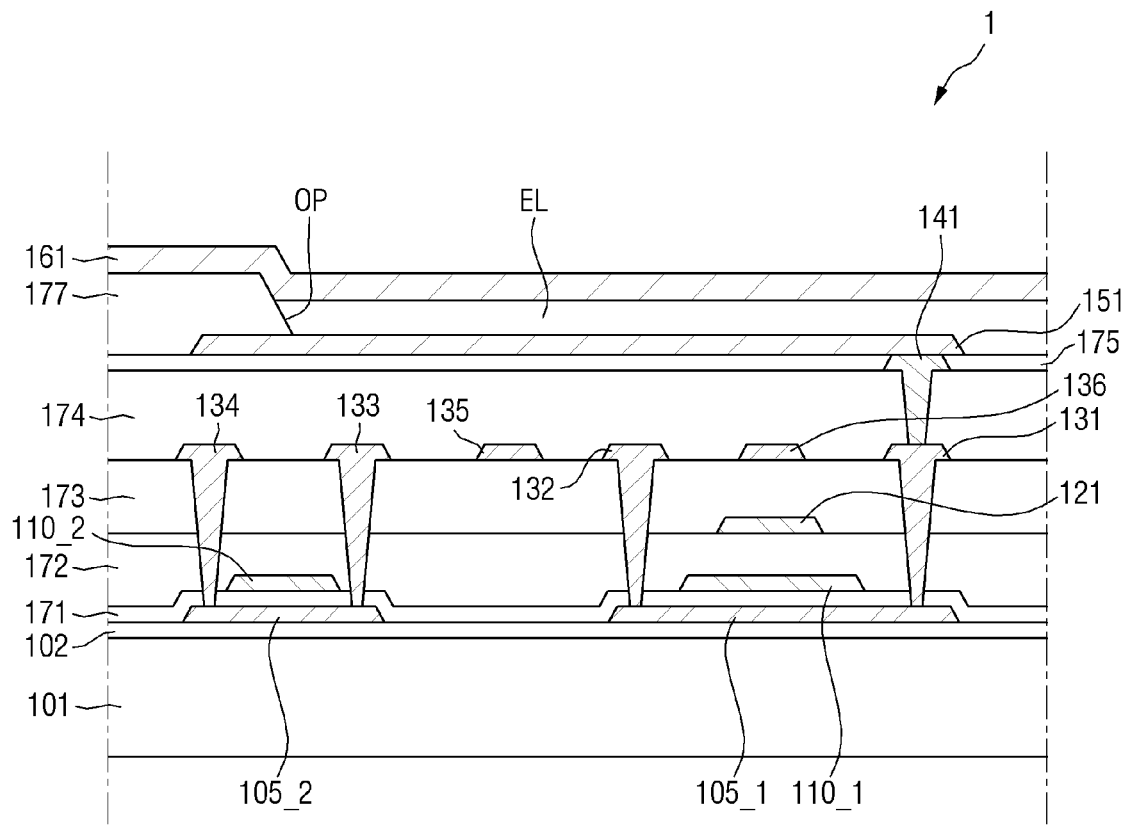
FIG. 3 is a schematic cross-sectional view showing a pixel of the display device of FIG. 1.

FIG. 3 is a schematic cross-sectional view showing an example of the display device of FIG. 1.

Referring to FIGS. 1 to 3, the display device 1 may include a substrate 101, a buffer layer 102, a semiconductor layer 105, a first insulating layer 171, a first gate conductive layer 110, a second insulating layer 172, a second gate conductive layer 120, a third insulating layer 173, a first source/drain conductive layer 130, a fourth insulating layer 174, a second source/drain conductive layer 140, a fifth insulating layer 175, a first electrode layer 150, a light emitting element layer, and a second electrode layer 160. Thin film transistors may be formed in a region ranging from the semiconductor layer 105 to the second gate conductive layer 120, and thus the region ranging from the semiconductor layer 105 to the second gate conductive layer 120 may be collectively referred to as a driving element layer.

The substrate 101 may support the respective layers disposed thereon. The substrate 101 may be made of an insulating material. The substrate 101 may be made of an inorganic material such as glass or quartz, or may be made of an organic material such as polyimide. The substrate 101 may be a rigid substrate or a flexible substrate.

The buffer layer 102 may be disposed on the substrate 101. The buffer layer 102 may prevent diffusion of impurity ions, prevent penetration of moisture or external air, and perform a surface planarization function. The buffer layer 102 may include silicon nitride, silicon oxide, silicon oxynitride, or the like. The buffer layer 102 may be omitted depending on the type of the substrate 101, manufacturing considerations, and the like.

The semiconductor layer 105 may be disposed on the buffer layer 102. The semiconductor layer 105 may include first and second semiconductor patterns 105_1 and 105_2, and the first and second semiconductor patterns 105_1 and 105_2 may constitute channels of transistors. For example, the first semiconductor pattern 105_1 may form a channel of a driving transistor, and the second semiconductor pattern 105_2 may form a channel of a switching transistor.

The semiconductor layer 105 may include polycrystalline silicon. In the semiconductor layer 105, a portion (e.g., source and drain regions) connected to a source electrode and a drain electrode of the thin film transistor may be doped with impurity ions (e.g., p-type impurity ions). A trivalent dopant such as boron (B) may be used as the p-type impurity ions. The semiconductor layer 105 may include monocrystalline silicon, low-temperature polycrystalline silicon, amorphous silicon, or an oxide semiconductor such as ITZO or IGZO instead of the polycrystalline silicon.

The first insulating layer 171 may be disposed on the semiconductor layer 105. The first insulating layer 171 may be a gate insulating layer having a gate insulating function.

The first gate conductive layer 110 may be disposed on the first insulating layer 171. The first gate conductive layer 110 may include first and second gate conductive patterns 110_1 and 110_2. The first and second gate conductive patterns 110_1 and 110_2 may include gate electrodes of transistors, respectively. For example, the first gate conductive pattern 110_1 may include a gate electrode of the driving transistor, and the second gate conductive pattern 110_2 may include a gate electrode of the switching transistor.

The first gate conductive layer 110 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second insulating layer 172 may be disposed on the first gate conductive layer 110. The second insulating layer 172 may be an interlayer insulating layer.

The second gate conductive layer 120 may be disposed on the second insulating layer 172. The second gate conductive layer 120 may include materials exemplified as the constituent materials of the first gate conductive layer 110.

The second gate conductive layer 120 may include a third gate conductive pattern 121. The third gate conductive pattern 121 may include a second electrode of a sustain capacitor. The third gate conductive pattern 121 may overlap the first gate conductive pattern 110_1 with the second insulating layer 172 interposed therebetween to form a capacitor. The third gate conductive pattern 121 may include materials exemplified as the constituent materials of the first gate conductive layer 110.

The third insulating layer 173 may be disposed on the second gate conductive layer 120.

The first source/drain conductive layer 130 may be disposed on the third insulating layer 173.

The first source/drain conductive layer 130 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first source/drain conductive layer 130 may be a single layer or a multilayer. For example, the first source/drain conductive layer 130 have a stacked structure of Ti/Al/Ti, Mo/Al/Mo, Mo/AlGe/Mo, or Ti/Cu.

The first source/drain conductive layer 130 may include a first source electrode 131 and a first drain electrode 132 of the driving transistor, a second source electrode 133 and a second drain electrode 134 of the switching transistor, a data wiring 135 and a first power supply wiring 136.

The first source electrode 131 may be in contact with the first semiconductor pattern 105_1 through a contact hole passing through the second insulating layer 172 and the third insulating layer 173 to expose one end of the first semiconductor pattern 105_1.

Further, the first drain electrode 132 may be in contact with the first semiconductor pattern 105_1 through a contact hole passing through the second insulating layer 172 and the third insulating layer 173 to expose the other end of the first semiconductor pattern 105_1.

Further, the second source electrode 133 may be in contact with the second semiconductor pattern 105_2 through a contact hole passing through the second insulating layer 172 and the third insulating layer 173 to expose one end of the second semiconductor pattern 105_2.

Further, the second drain electrode 134 may be in contact with the second semiconductor pattern 105_2 through a contact hole passing through the second insulating layer 172 and the third insulating layer 173 to expose the other end of the second semiconductor pattern 105_2.

The fourth insulating layer 174 may be disposed on the first source/drain conductive layer 130, and the second source/drain conductive layer 140 may be disposed on the fourth insulating layer 174. The second source/drain conductive layer 140 may include a metal forming the first source/drain conductive layer 130.

The second source/drain conductive layer 140 may include a first connection electrode 141. The first connection electrode 141 may be disposed to overlap the first source electrode 131 in plan view. The first connection electrode 141 may be electrically connected to the source electrode 131 of the driving transistor through a contact hole passing through the fourth insulating layer 174.

The upper surface of the first connection electrode 141 may be in contact with the lower surface of an anode electrode 151. The lower surface of the first connection electrode 141 may be in contact with the upper surface of the fourth insulating layer 174. The side surface of the first connection electrode 141 may be disposed between the upper surface and the lower surface of the first connection electrode 141.

The fifth insulating layer 175 may be disposed on the second source/drain conductive layer 140. The fifth insulating layer 175 may include an organic insulating material.

The upper surface of the fifth insulating layer 175 may be in contact with the lower surface of the anode electrode 151, and the lower surface of the fifth insulating layer 175 may be in contact with the upper surface of the fourth insulating layer 174. Further, the fifth insulating layer 175 may surround the first connection electrode 141, and the side surface of the first connection electrode 141 may be in contact with the side surface of the fifth insulating layer 175. The side surface of the first connection electrode 141 may have an inclination of an acute angle, and the sidewall of the fifth insulating layer 175, which is in contact with the side surface of the first connection electrode 141, may have an inclination of an obtuse angle. In other words, the side surface of the first connection electrode 141 may be inclined at an acute angle between the side surface of the first connection electrode 141 and a lower surface of the first connection electrode 141, and the sidewall of the fifth insulating layer 175 may be inclined at an obtuse angle between the sidewall of the fifth insulating layer 175 and a lower surface of the fifth insulating layer 175.

The thickness of the first connection electrode 141 and the thickness of the fifth insulating layer 175 may be substantially equal to each other. As used herein, the term substantially may mean as imparting a deviation of the associated parameter that is five percent or less therefrom. For example, the one of the aforementioned thicknesses may deviate from the other thereof by five percent or less and still be considered to be substantially equal to the other thickness. Other percentages may also be applicable as the aforementioned is merely exemplary.

The upper surface of the first connection electrode 141 and the upper surface of the fifth insulating layer 175 may be disposed at the same level from the substrate 101. For example, such disposition of the respective upper surfaces at the same level from the surface of the substrate 101 may mean that the distance from the surface of the substrate 101 to each upper surface is substantially the same. That is, the average distance from the upper surface of the first connection electrode 141 to the upper surface of the substrate 101 may be substantially equal to the average distance from the upper surface of the fifth insulating layer 175 to the upper surface of the substrate 101. As a result, the upper surface of the first connection electrode 141 may extend to meet portions of the upper surface of the fifth insulating layer 175 and extend with those upper surface portions of the fifth insulating layer 175, such that the upper surface of the first connection electrode 141 and the upper surface of the fifth insulating layer 175 are disposed in a common plane, i.e., are coplanar.

The average distance from the upper surface of the first connection electrode 141 to the upper surface of the fourth insulating layer 174 may be substantially equal to the average distance from the upper surface of the fifth insulating layer 175 to the upper surface of the fourth insulating layer 174.

The term, average distance, may be understood as that distance which includes an intervening space between two parts, e.g., the first connection electrode 141 and the fourth insulating layer 174. That is, the average distance may include and may account for all surface contouring, material thicknesses, and material deposition forming the aforementioned two parts, as well as that of any intervening part or parts between the two parts. As such, the average distance may describe a relative distance that accurately reflects the relationship among the two parts irrespective of their constructions and the constructions of one or more parts intervening therebetween.

The first connection electrode 141 and the fifth insulating layer 175 may not overlap each other in the thickness direction. There may be an exceptional area to such non-overlapping between the first connection electrode 141 and the fifth insulating layer 175 in the thickness direction. For example, the exceptional area may include an area where the inclined side surfaces of the first connection electrode 141 are in contact with the inclined sidewalls of the fifth insulating layer 175. In other words, the side surfaces of the first connection electrode 141 and the sidewalls of the fifth insulating layer 175 may overlap each other in the thickness direction.

The side surface of the first connection electrode 141 may not be in contact with the anode electrode 151. The upper surface of the first connection electrode 141 may not be in contact with the fifth insulating layer 175.

The thickness of the first connection electrode 141 may be larger than the thickness of the fifth insulating layer 175.

The average distance from the upper surface of the first connection electrode 141 to the upper surface of the substrate 101 may be larger than the average distance from the upper surface of the fifth insulating layer 175 to the upper surface of the substrate 101.

The average distance from the upper surface of the first connection electrode 141 to the upper surface of the fourth insulating layer 174 may be larger than the average distance from the upper surface of the fifth insulating layer 175 to the upper surface of the fourth insulating layer 174.

The side surface of the first connection electrode 141 may be partially in contact with the anode electrode 151. The upper surface of the first connection electrode 141 may not be in contact with the fifth insulating layer 175.

The thickness of the fifth insulating layer 175 may be smaller than the thickness of the second insulating layer 172, the third insulating layer 173 and/or the fourth insulating layer 174.

The surface roughness of the upper surface of the fifth insulating layer 175 may be larger than the surface roughness of the upper surface of the second insulating layer 172, the third insulating layer 173 and/or the fourth insulating layer 174.

Further, the surface roughness of the upper surface of the fifth insulating layer 175 may be larger than the surface roughness of the upper surface of the first connection electrode 141.

The surface roughness of the upper surface of the first connection electrode 141 may be larger than the surface roughness of the side surface of the first connection electrode 141.

The first electrode layer 150 may be disposed on the fifth insulating layer 175. The first electrode layer 150 may include the anode electrode 151 of the light emitting element OLED. The anode electrode 151 may be in direct contact with the first connection electrode 141.

The anode electrode 151 may have a uniform thickness. That is, the average distance from the upper surface of the anode electrode 151 to the upper surface of the fifth insulating layer 175 may be substantially the same as the average distance from the upper surface of the anode electrode 151 to the upper surface of the first connection electrode 141. That is, the anode electrode 151 may be in direct contact with the first connection electrode 141 without a separate contact hole. Accordingly, since a contact pad region may be omitted, an area of the pixel PX may be optimized as high resolution thereof may also be achieved.

The light emitting element layer may be disposed on the first electrode layer 150, and the light emitting element layer may include a pixel defining layer 177 and an organic light emitting layer EL.

The pixel defining layer 177 may be disposed on the anode electrode 151 along the edge of the anode electrode 151, and may include an opening exposing the anode electrode 151. The opening may overlap a region where the anode electrode 151 and the first connection electrode 141 are in contact with each other.

The organic light emitting layer EL may be disposed in the opening of the pixel defining layer 177. The organic light emitting layer EL may include an organic light emitting layer, a hole injecting/transporting layer, and an electron injecting/transporting layer. The organic light emitting layer EL may overlap a region where the anode electrode 151 and the first connection electrode 141 are in contact with each other.

The second electrode layer 160 may be disposed on the organic light emitting layer EL and the pixel defining layer 177. A cathode electrode 161 of the light emitting element OLED may be disposed in the second electrode layer 160. The cathode electrode 161 may be a common electrode disposed over the entire display area of the display device 1.

As described above, in the display device 1, the anode electrode 151 and the first connection electrode 141 may be in direct contact with each other without a separate contact hole. Accordingly, since the contact pad region may be omitted, the area of the pixel PX may be optimized as high resolution may also be easily achieved. In addition, by omitting the contact hole forming process, it is possible to reduce the number of hole forming masks, thereby reducing a cost associated with simplifying the manufacturing process of a pixel PX.

Further, since the anode electrode 151 and the organic light emitting layer EL can be formed flat with a uniform thickness, the display quality for an image be further improved.

Figure 4:
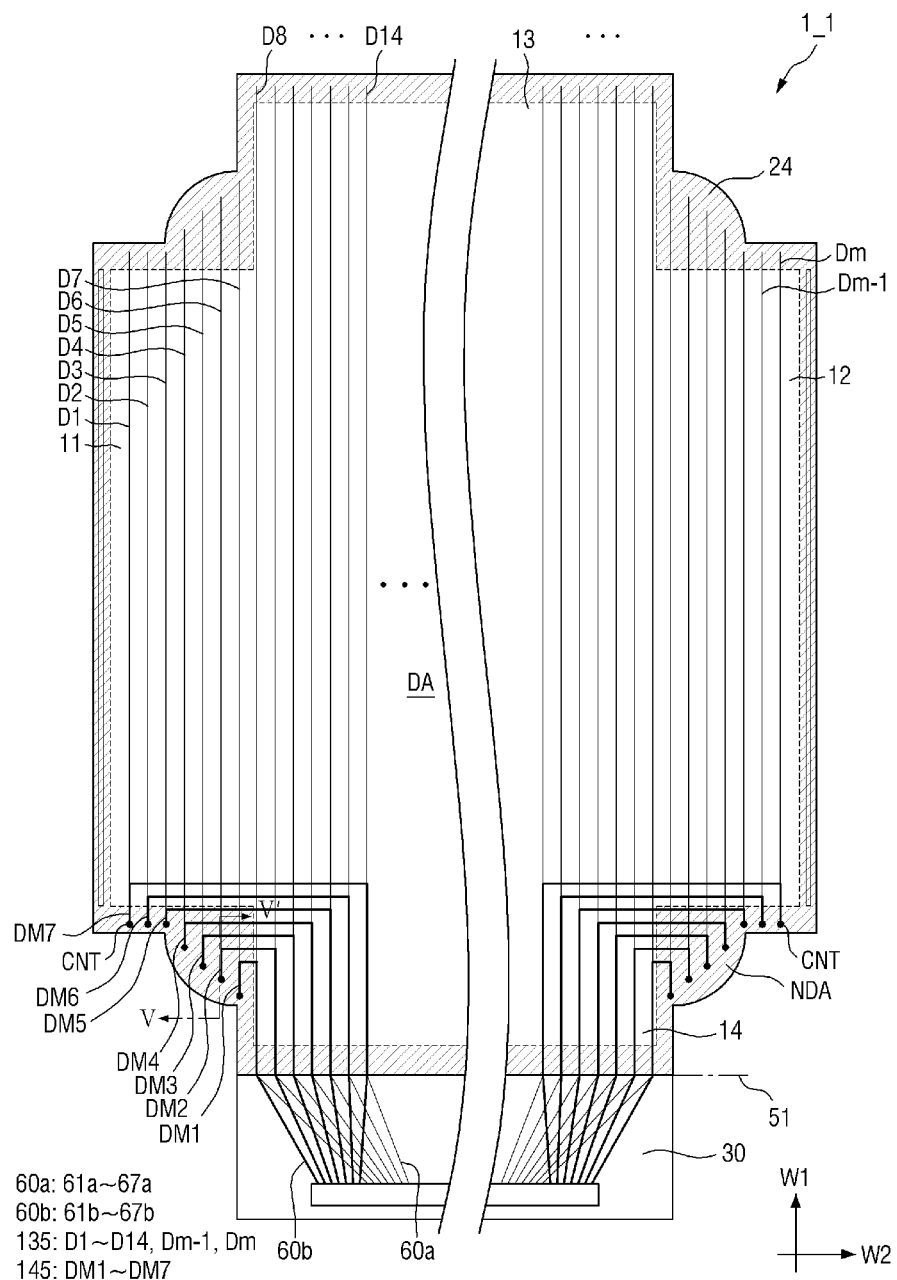
FIG. 4 is a plan view of a display device according to another embodiment.
Figure 5:
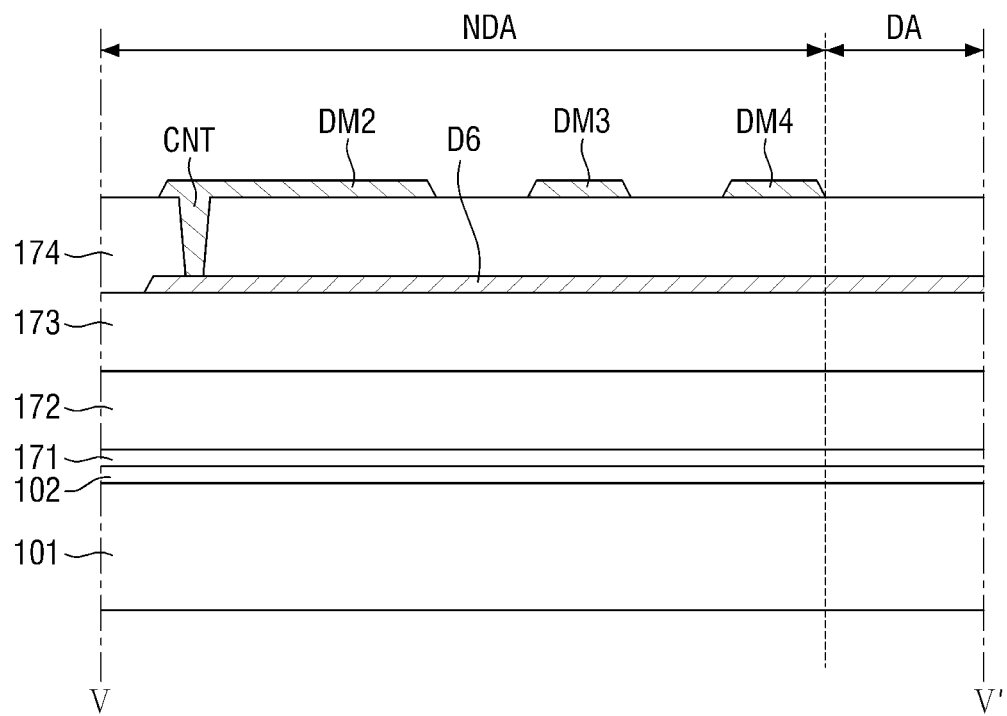
FIG. 5 is a schematic cross-sectional view taken along line V-V' of FIG. 4.
Figure 6:
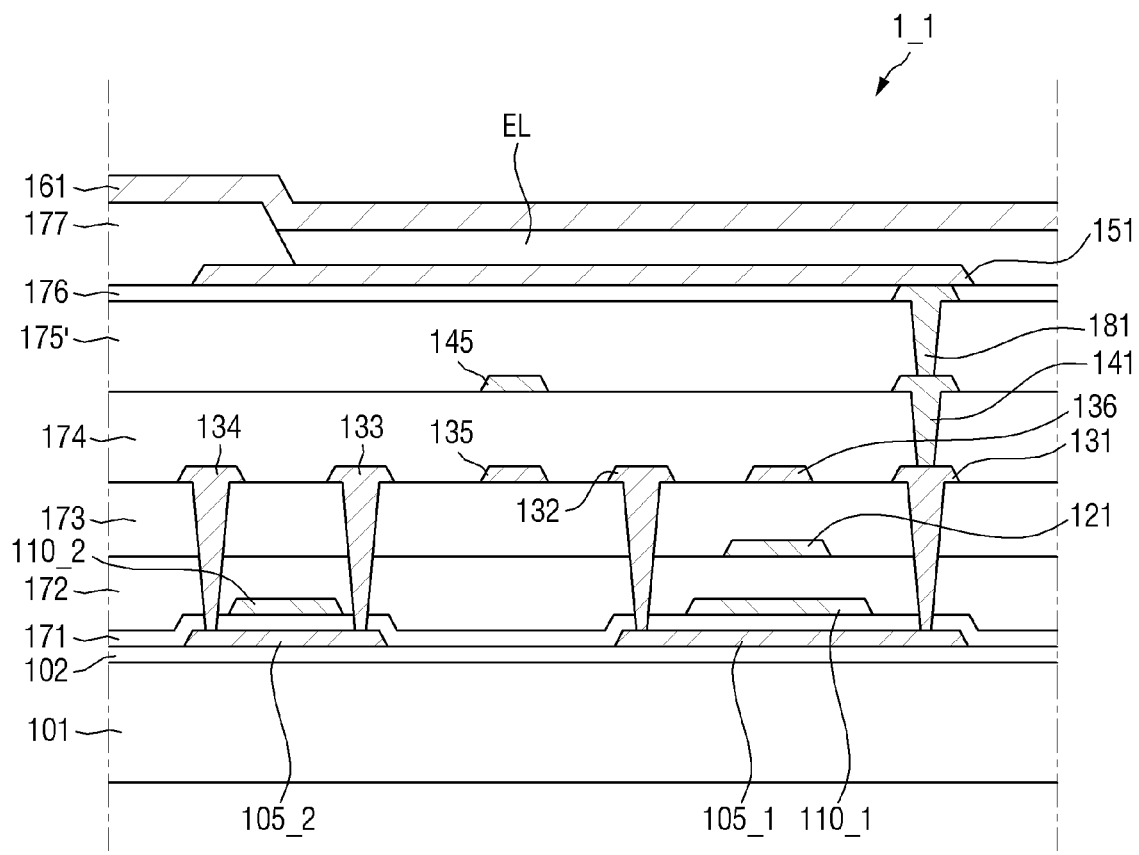
FIG. 6 is a schematic cross-sectional view showing a pixel of the display device of FIG. 4.

FIG. 4 is a plan view of a display device according to another embodiment. FIG. 5 is a schematic cross-sectional view taken along line V-V' of FIG. 4. FIG. 6 is a schematic cross-sectional view showing a pixel of the display device of FIG. 4.

Referring to FIGS. 4 to 6, a display device 1_1 according to the embodiment may include a data wiring 135, a connection wiring 145 and a driving wiring 60.

Meanwhile, the arrangement of the data wiring 135, the connection wiring 145 and the drive wiring 60 may be symmetrical with respect to a reference axis (not shown) extending in a first direction W1 and passing through the center of the area of the display device 1_1. Hereinafter, the data wiring 135, the connection wiring 145 and the drive wiring 60, which are relatively adjacent to the first sub-display surface 11, will be mainly described.

The data wiring 135 may include data lines D1 to Dm (where m is an integer of 3 or more).

The data lines D1 to Dm may extend in the first direction W1 and may be sequentially arranged at specific intervals along a second direction W2. Each of the data lines D1 to Dm may extend across the display area DA in the first direction W1. Here, among the data lines D1 to Dm, first to k-th data lines may be disposed on one display surface (where k is a positive integer equal to or greater than 2 but less than m). Hereinafter, an instance in which k is 7 and m is greater than 14 will be described as an example.

The connection wiring 145 may electrically connect a portion of the data wiring 135 and a portion of the drive wiring 60. The connection wiring 145 may be disposed on a layer different from the layer where the data wiring 135 is disposed, and the connection wiring 145 may be insulated from the data wiring 135 through an insulating layer, which will be described later with reference to FIG. 6.

The connection wiring 145 may include first to $k^{th}$ connection lines DM1 to DMk corresponding to the first to $m^{th}$ data lines D1 to Dm. When k is 7, the connection wiring 145 may include the first to seventh connection lines DM1 to DM7. The connection lines DM1 to DM7 may correspond to the data lines D1 to D7 disposed on the first sub-display surface 11, respectively.

The connection lines DM1 to DMk may extend from the fourth non-display area NDA4 (e.g., a lower portion of the fourth non-display area NDA4) of the fourth sub-display surface 14 to one end (e.g., the first corner wing 21 and a lower portion of the first non-display area NDA1 of the first sub-display surface 11) of the corresponding data wiring 135 via the display area DA. The connection lines DM1 to DMk may be separated from each other at predetermined intervals of spacing. The interval of spacing between each of the connection lines DM1 to DMk may be equal to the interval of spacing between each of the data lines D1 to Dm.

Further, the connection lines DM1 to DMk may extend from the fourth non-display area NDA4 (e.g., a lower portion of the fourth non-display area NDA4) of the fourth sub-display surface 14 in the first direction W1 (e.g., upward), extend to change the direction to the second direction W2 (e.g., leftward) in the display area DA, and extend to one end (i.e., a lower portion of the first non-display area NDA1 of the first sub-display surface 11) of the corresponding data wiring 135 in a region adjacent to or intersecting with the corresponding data wiring 135.

Each of the connection lines DM1 to DMk may include a first portion extending from the fourth non-display area NDA4 in the first direction W1, a second portion extending from one end of the first portion in the second direction W2, and a third portion extending from one end of the second portion in the first direction W1 (or a direction opposite to the first direction W1).

As shown in FIG. 4, the first portion of each of the connection lines DM1 to DMk may overlap one of the data lines D1 to Dm in the display area DA in plan view. For example, the first portion of the first connection line DM1 may overlap the eighth data line D8, and the first portion of the seventh connection line DM7 may overlap the fourteenth data line D14. However, this is merely exemplary, and the disclosure is not limited thereto. For example, the first portion of each of the first to seventh connection lines DM1 to DM7 may not overlap the first to $m^{th}$ data lines D1 to Dm in the display area DA in plan view.

Further, as shown in FIG. 4, the third portion of each of the connection lines DM1 to DMk may be disposed to overlap one of the data lines D1 to Dm in plan view. For example, the third portion of the first connection line DM1 may overlap the seventh data line D7, and the third portion of the second connection line DM2 may overlap the sixth data line D6.

Meanwhile, although FIG. 4 illustrates that the connection wiring 145 is bent at a right angle, the disclosure is not limited thereto.

The connection lines 145 do not intersect each other in plan view and, thus, may be disposed to bypass other connection lines relatively adjacent to the first corner wing 21. For example, the first connection line DM1 may be disposed to bypass the second connection line DM2. That is, as the connection line 145 may be disposed closer to the corner wing (e.g., the first corner wing 21), the connection line 145 may be bent at a position closer to the driving area 30, and as the connection line 145 may be disposed further away from the corner wing, the connection line 145 may be bent at a position further separated from the driving area 30.

As the connection line relatively separated from the first corner wing 21 may be disposed to bypass other connection lines relatively adjacent to the first corner wing 21, the connection lines 145 may have different lengths. For example, the length of the second connection line DM2 may be longer than the length of the first connection line DM1. That is, the length of the $(i+1)^{th}$ connection line DMi+1 may be longer than the length of the $i^{th}$ connection line DMi (where i is a positive integer).

The connection lines 145 may be directly connected one-to-one to the data lines 135, respectively, through contact holes CNT (i.e., contact holes CNT formed in the non-display area NDA) formed in the second corner wing 22 and the lower portion of the first non-display area NDA1. For example, the first connection line DM1 may be electrically connected to the seventh data line D7, and the seventh connection line DM7 may be electrically connected to the first data line D1. That is, the $i^{th}$ connection line DMi may be electrically connected to the $(k+1-i)^{th}$ data line DMk+1−i.

For example, as shown in FIG. 5, the sixth data line D6 may be disposed on the third insulating layer 173, the second to fourth connection lines DM2 to DM4 may be disposed on the fourth insulating layer 173, and the second to fourth connection lines DM2 to DM4 may be insulated from the sixth data line D6 by the fourth insulating layer 174. The second connection line DM2 may extend to one end of the sixth data line D6 and may be electrically connected to the sixth data line D6 through the contact hole CNT passing through the fourth insulating layer 174 to expose one end of the sixth data line D6.

The driving wiring 60 may include driving lines 61a to 67a and 61b to 67b (or pad wirings and pad connection wirings), and the driving lines 61a to 67a and 61b to 67b may extend from the driving chip 40 (or a pad portion on which the driving chip 40 is disposed) to the fourth non-display area NDA4 (or a tangent line of the fourth sub-display surface 14 and the driving area 30) of the fourth sub-display surface 14.

The driving lines 61a to 67a and 61b to 67b may be divided into a first driving wiring group 60a and a second driving wiring group 60b.

The driving lines 61a to 67a included in the first driving wiring group 60a may be disposed on a layer different from the layer on which the driving lines 61b to 67b included in the second driving wiring group 60b may be disposed. The driving lines 61a to 67a included in the first driving wiring group 60a may intersect the driving lines 61b to 67b included in the second driving wiring group 60b in plan view. The driving lines 61a to 67a included in the first driving wiring group 60a may be insulated from the driving lines 61b to 67b included in the second driving wiring group 60b through a separate insulating layer.

The driving lines 61a to 67a included in the first driving wiring group 60a may be electrically connected to the data lines D1 to D7 disposed on the first sub-display surface 11 through the connection lines DM1 to DM7, respectively. The driving lines 61b to 67b included in the second driving wiring group 60b may be electrically connected to the data lines D8 to D14 disposed on the main display surface 10, respectively.

As described above, the display device 1 may include the connection wiring 145 disposed in an area including the display area DA, and an image signal may be provided from the driving chip 40 to the data lines D1 to Dm disposed on the first sub-display surface 11 (and the second sub-display surface 12) through the connection wiring 145. Thus, a dead space which may be required to directly connect the data wiring 135 disposed on the first sub-display surface 11 (and the second sub-display surface 12) to the driving wiring 60 may be unnecessary. In other words, no dead space is necessitated to connect the data wiring 135 to the driving wiring 60 since the image signal from the driving chip 40 may be provided to the data wiring 135 (or the data lines D1 to Dm) through the connection wiring 145 (or the connection lines DM1 to DM7). As a result, overall dead space of the display device 1 may be reduced or its increase may be prevented.

Further, by forming the contact hole CNT electrically connecting the data wiring 135 to the connection wiring 145 in the non-display area NDA, it is possible to prevent the interference of the contact hole CNT with respect to the pixel PX (or a constitutive signal provided to the pixel PX). Therefore, the display quality of the display device 1 may be improved.

The pixel configuration of the above-described display device 1_1 will be described in more detail below. The display device 1_1 of FIG. 6 may be substantially the same as or similar to the display device 1 of FIG. 3 other than aspects of the second source/drain conductive layer 140, a third source/drain conductive layer 180, the fifth insulating layer 175 and a sixth insulating layer 176.

The second source/drain conductive layer 140 may include the connection wiring 145 (i.e., the connection wiring 145 described with reference to FIG. 4). The connection wiring 145 may be disposed to overlap the data wiring 135 in plan view.

A fifth insulating layer 175' may be disposed on the second source/drain conductive layer 140, and the third source/drain conductive layer 180 may be disposed on the fifth insulating layer 175'. The third source/drain conductive layer 180 may include a metal constituting the first source/drain conductive layer 130 and/or the second source/drain conductive layer 140.

The third source/drain conductive layer 180 may include a second connection electrode 181. The second connection electrode 181 may be disposed to overlap the first connection electrode 141 in plan view. The second connection electrode 181 may be in contact with the first connection electrode 141 through the contact hole passing through the fifth insulating layer 175', and may be electrically connected to the first source electrode 131 of the driving transistor.

The upper surface of the second connection electrode 181 may be in contact with the lower surface of the anode electrode 151. The lower surface of the second connection electrode 181 may be in contact with the upper surface of the fifth insulating layer 175'. The side surface of the second connection electrode 181 may be disposed between the upper surface and the lower surface of the second connection electrode 181.

The sixth insulating layer 176 may be disposed on the third source/drain conductive layer 180. The sixth insulating layer 176 may include an organic insulating material.

The upper surface of the sixth insulating layer 176 may be in contact with the lower surface of the anode electrode 151, and the lower surface of the sixth insulating layer 176 may be in contact with the upper surface of the fifth insulating layer 175'. Further, the sixth insulating layer 176 may be disposed around or to surround the second connection electrode 181, and the side surface of the second connection electrode 181 may be in contact with the side surface of the sixth insulating layer 176. The side surface of the second connection electrode 181 may have an inclination of an acute angle, and the sidewall of the sixth insulating layer 176, which is in contact with the side surface of the second connection electrode 181, may have an inclination of an obtuse angle. In other words, the side surface of the second connection electrode 181 may be inclined at an acute angle between the side surface of the second connection electrode 181 and a lower surface of the second connection electrode 181, and the sidewall of the sixth insulating layer 176 may be inclined at an obtuse angle between the sidewall of the sixth insulating layer 176 and a lower surface of the sixth insulating layer 176.

The thickness of the second connection electrode 181 and the thickness of the sixth insulating layer 176 may be substantially equal to each other.

The upper surface of the second connection electrode 181 and the upper surface of the sixth insulating layer 176 may be disposed at the same level from the substrate 101. That is, the average distance from the upper surface of the second connection electrode 181 to the upper surface of the substrate 101 may be substantially equal to the average distance from the upper surface of the sixth insulating layer 176 to the upper surface of the substrate 101.

The average distance from the upper surface of the second connection electrode 181 to the upper surface of the fifth insulating layer 175' may be substantially equal to the average distance from the upper surface of the sixth insulating layer 176 to the upper surface of the fifth insulating layer 175'.

The second connection electrode 181 and the sixth insulating layer 176 may not overlap each other in the thickness direction.

However, the disclosure is not limited thereto, and the thickness of the second connection electrode 181 may be greater than the thickness of the sixth insulating layer 176.

For example, average distance from the upper surface of the second connection electrode 181 to the upper surface of the substrate 101 may be larger than the average distance from the upper surface of the sixth insulating layer 176 to the upper surface of the substrate 101.

Further, the average distance from the upper surface of the second connection electrode 181 to the upper surface of the fifth insulating layer 175' may be larger than the average distance from the upper surface of the sixth insulating layer 176 to the upper surface of the fifth insulating layer 175'.

Further, the thickness of the sixth insulating layer 176 may be smaller than the thickness of the second insulating layer 172, the third insulating layer 173, the fourth insulating layer 174 and/or the fifth insulating layer 175.

The surface roughness of the upper surface of the sixth insulating layer 176 may be larger than the surface roughness of the upper surface of the second insulating layer 172, the third insulating layer 173, the fourth insulating layer 174 and/or the fifth insulating layer 175.

Further, the surface roughness of the upper surface of the sixth insulating layer 176 may be larger than the surface roughness of the upper surface of the second connection electrode 181.

The surface roughness of the upper surface of the second connection electrode 181 may be larger than the surface roughness of the side surface of the second connection electrode 181.

The first electrode layer 150 may be disposed on the sixth insulating layer 176. The first electrode layer 150 may include the anode electrode 151 of the light emitting device OLED. The anode electrode 151 may be in direct contact with the second connection electrode 181.

One surface of the sixth insulating layer 176 may be in contact with the lower surface of the anode electrode 151.

The average distance from the upper surface of the anode electrode 151 to the upper surface of the sixth insulating layer 176 may be substantially the same as the average distance from the upper surface of the anode electrode 151 to the upper surface of the second connection electrode 181. That is, the anode electrode 151 may be in direct contact with the second connection electrode 181 without a separate contact hole.

The contact area between the anode electrode 151 and the second connection electrode 181 may be larger than the contact area between the sixth insulating layer 176 and the second connection electrode 181.

Although not shown in the drawings, the driving lines (i.e., driving lines connected to the connection wiring 145) included in the first driving wiring group 60*a* may be disposed on the second gate conductive layer 120, and the driving lines (i.e., driving lines directly connected to the data lines) included in the second driving wiring group 60*b* may be disposed on the first gate conductive layer 110.

In the display device 1_1, the anode electrode 151 and the second connection electrode 181 may be in direct contact with each other without a separate contact hole. Thus, it may possible to realize high resolution by omitting the contact pad region and to simplify the manufacturing process by omitting the contact hole forming process, as described above.

Figure 7:
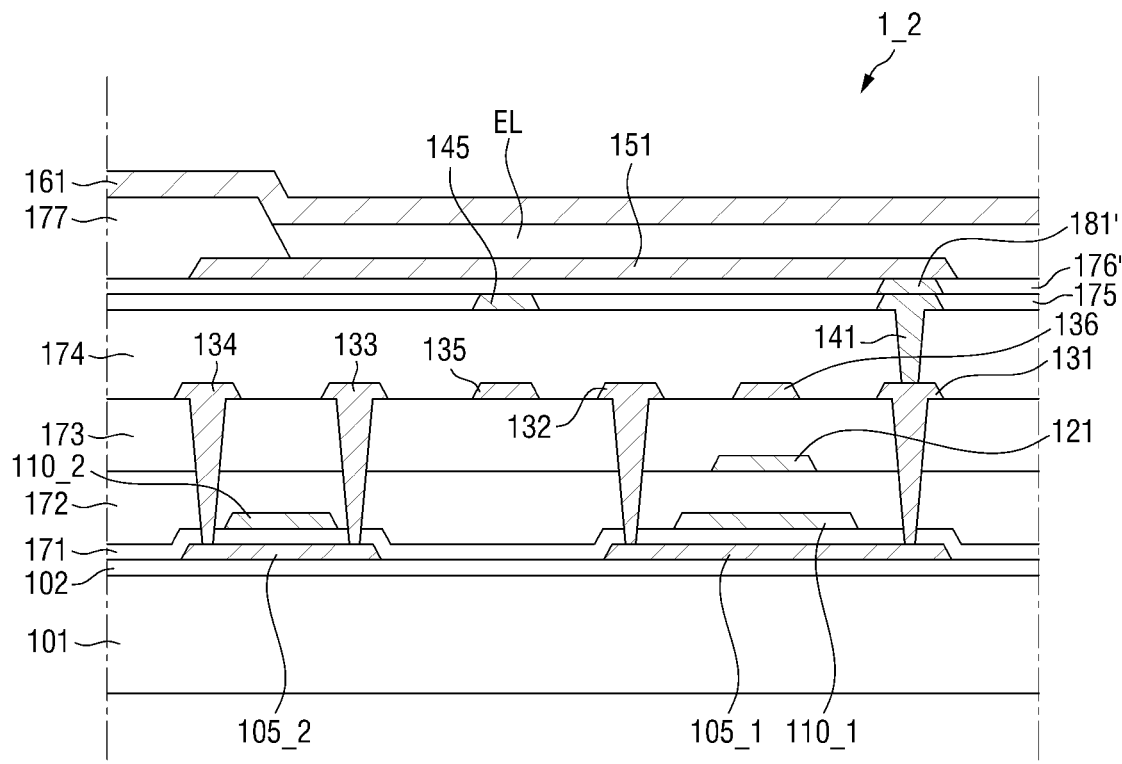
FIG. 7 is a schematic cross-sectional view showing a pixel of a display device according to another embodiment.

FIG. 7 is a cross-sectional view showing a pixel of a display device according to still another embodiment.

Referring to FIG. 7, a display device 1_2 according to the embodiment differs from the embodiment of FIG. 6 in that a second connection electrode 181' may be in contact with the first connection electrode 141 without a separate contact hole.

The upper surface of the second connection electrode 181' may be in contact with the lower surface of the anode electrode 151, and the lower surface of the second connection electrode 181' may be in direct contact with the upper surface of the first connection electrode 141 and the upper surface of the fifth insulating layer 175.

The upper surface of a sixth insulating layer 176' may be in contact with the lower surface of the anode electrode 151, and the lower surface of the sixth insulating layer 176' may be in contact with the upper surface of the fifth insulating layer 175.

The thickness of the sixth insulating layer 176' may be the same as the thickness of the second connection electrode 181'.

The average distance from the upper surface of the sixth insulating layer 176' to the upper surface of the fifth insulating layer 175 may be substantially the same as the average distance from the upper surface of the second connection electrode 181' to the upper surface of the first connection electrode 141.

Further, the average distance from the upper surface of the sixth insulating layer 176' to the upper surface of the fifth insulating layer 175 may be substantially the same as the average distance from the upper surface of the second connection electrode 181' to the upper surface of the fifth insulating layer 175.

The upper surface of the first connection electrode 141 may be in contact with the lower surface of the second connection electrode 181', and the lower surface of the first connection electrode 141 may be in contact with the upper surface of the fourth insulating layer 174.

The upper surface of the connection wiring 145 may be in contact with the lower surface of the fifth insulating layer 175', and the lower surface of the connection wiring 145 may be in contact with the upper surface of the fourth insulating layer 174.

The thickness of the first connection electrode 141 and the connection wiring 145 may be the same as the thickness of the fifth insulating layer 175'.

The average distance from the upper surface of the fifth insulating layer 175 to the upper surface of the fourth insulating layer 174 may be substantially the same as the average distance from the upper surface of the first connection electrode 141 to the upper surface of the fourth insulating layer 174.

The average distance from the upper surface of the fifth insulating layer 175 to the upper surface of the fourth insulating layer 174 may be substantially the same as the average distance from the upper surface of the connection wiring 145 to the upper surface of the fourth insulating layer 174.

The thickness of the anode electrode 151 may be uniform.

The average distance from the upper surface of the anode electrode 151 to the upper surface of the fifth insulating layer 175 may be substantially the same as the average distance from the upper surface of the anode electrode 151 to the upper surface of the first connection electrode 141.

The contact area between the anode electrode 151 and the second connection electrode 181' may be larger than the contact area between the sixth insulating layer 176' and the second connection electrode 181'.

The thickness of the sixth insulating layer 176' and/or the fifth insulating layer 175 may be smaller than the thickness of the fourth insulating layer 174, the third insulating layer 173 and/or the second insulating layer 172.

The surface roughness of the upper surface of the sixth insulating layer 176' and the fifth insulating layer 175 may be larger than the surface roughness of the upper surface of the fourth insulating layer 174, the third insulating layer 173 and/or the second insulating layer 172.

The surface roughness of the upper surface of the sixth insulating layer 176' and the fifth insulating layer 175 may be larger than the surface roughness of the upper surface of the first connection electrode 141 and the second connection electrode 181'.

The surface roughness of the upper surface of the first connection electrode 141 and the second connection electrode 181' may be larger than the surface roughness of the side surface of the first connection electrode 141 and the second connection electrode 181'.

In the display device 1_2, the anode electrode 151 and the second connection electrode 181' may be in direct contact with each other without a separate contact hole, and the second connection electrode 181' and the first connection electrode 141 may be in direct contact with each other without a separate contact hole. Accordingly, the thickness of the display device 1_2 may be reduced by a size of a contact hole as described above, and thus the flexibility of the display device 1_2 can be increased due to the reduction in thickness. It may also be possible to realize a high resolution of the display device 1_2 by omitting the contact pad region and to simplify the manufacturing process, as described similarly above with respect to the discussed embodiments.

A method of manufacturing a display device according to an embodiment is provided below with respect to, for example, the display device of FIGS. 1-3.

FIGS. 8 to 12 are schematic cross-sectional views showing the steps of a method of manufacturing a display device.

Figure 8:
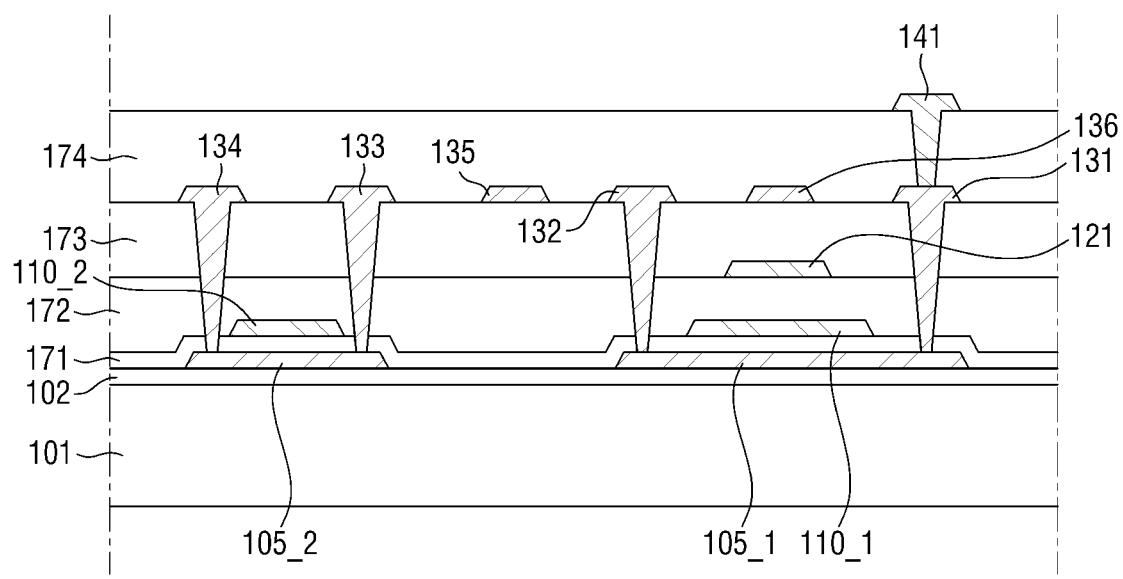
FIGS. 8 to 12 are schematic cross-sectional views showing a method of manufacturing a display device according to an embodiment.

Referring to FIG. 8, the method of manufacturing a display device according to an embodiment includes forming, on a substrate 101, a buffer layer 102, a semiconductor layer 105_1 and 105_2, a first insulating layer 171, a first gate conductive layer 110_1 and 110_2, a second insulating layer 172, a second gate conductive layer 121, a third insulating layer 173, a first source/drain conductive layer 131, 132, 133, 134, 135 and 136, a fourth insulating layer 174, and a second source/drain conductive layer 141.

Specifically, the buffer layer 102 may be formed of a silicon oxide (SiOx) film, a silicon nitride (SiNx) film, or a multilayer thereof. The buffer layer 102 may be formed by chemical vapor deposition.

A semiconductor pattern 105_1 and a second semiconductor pattern 105_2 may be formed by depositing a semiconductor film on one surface of the buffer layer 102 and then patterning the semiconductor film by an etching process using a photoresist pattern.

The first insulating layer 171 may be formed of a silicon oxide (SiOx) film, a silicon nitride (SiNx) film, or a multilayer film thereof on the semiconductor layer 105_1 and 105_2. The first insulating layer 171 may be formed by chemical vapor deposition.

A first gate conductive pattern 110_1 and a second gate conductive pattern 110_2 may be formed by depositing a first gate conductive film on the first insulating layer 171 and then patterning the first gate conductive film.

The second insulating layer 172 may be formed of a silicon oxide (SiOx) film, a silicon nitride (SiNx) film, or a multilayer film thereof on the first gate conductive layer 110_1 and 110_2. The second insulating layer 172 may be formed by chemical vapor deposition.

A third gate conductive pattern 121 may be formed by depositing a second gate conductive film on one surface of the second insulating layer 172 and then patterning the second gate conductive film.

The third insulating layer 173 may be formed of a silicon oxide (SiOx) film, a silicon nitride (SiNx) film, or a multi-layer film thereof on the second gate conductive layer 120. The third insulating layer 173 may be formed by chemical vapor deposition.

A first source electrode 131, a first drain electrode 132, a second source electrode 133, a second drain electrode 134, a data wiring 135 and a first power supply wiring 136 may be formed by depositing a first source/drain conductive film on one surface of the third insulating layer 173 and then patterning the first source/drain conductive film.

The fourth insulating layer 174 may be formed of a silicon oxide (SiOx) film, a silicon nitride (SiNx) film, or a multi-layer film thereof on the first source/drain conductive layer 130. The fourth insulating layer 174 may be formed by chemical vapor deposition.

A first connection electrode 141 may be formed by depositing a second source/drain conductive film on one surface of the fourth insulating layer 174 and then patterning the second source/drain conductive film.

Figure 9:
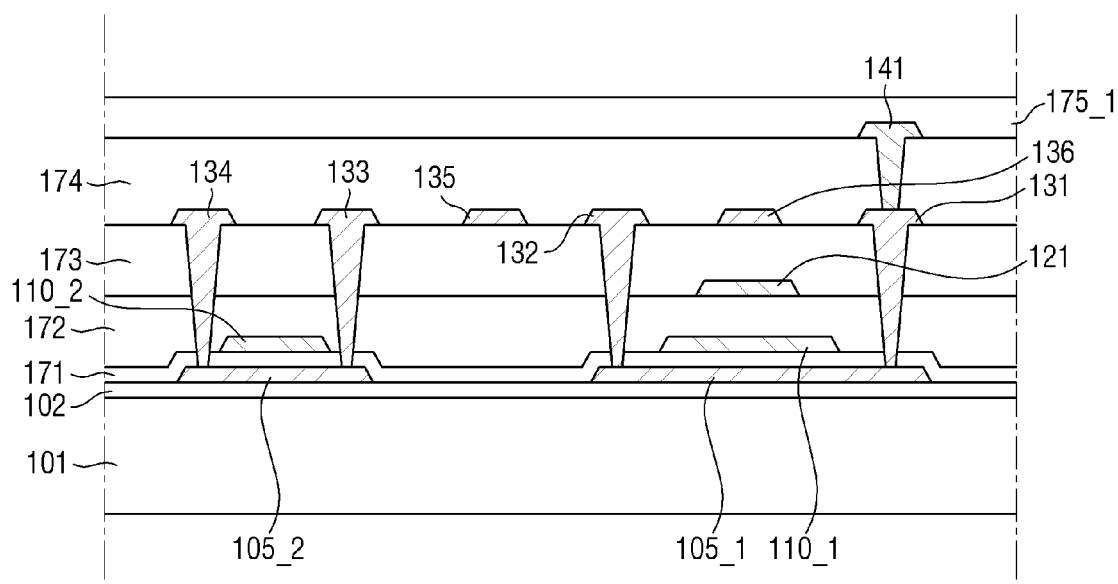

Referring to FIG. 9, a fifth insulating film 175_1 may be formed on the first source/drain conductive layer 130. The fifth insulating film 175_1 may be formed of an organic film such as acryl resin, epoxy resin, phenolic resin, polyamide resin, polyimide resin and the like.

Figure 10:
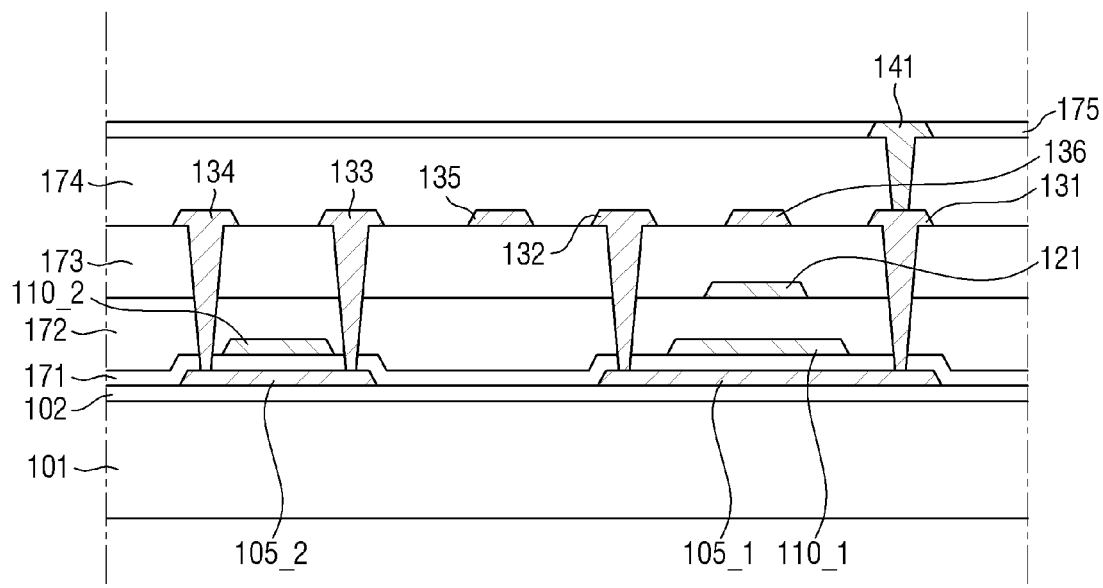

Referring to FIG. 10, the surface of the first connection electrode 141 and the fifth insulating film 175_1 may be planarized by a chemical mechanical polishing (CMP) process to form a fifth insulating layer 175. Since a difference in leveling between the first connection electrode 141 and the fifth insulating layer 175 can be removed by the polishing process, it may be possible to prevent reflection of external light due to the difference, thereby improving the display quality of an image to be displayed.

Figure 11:
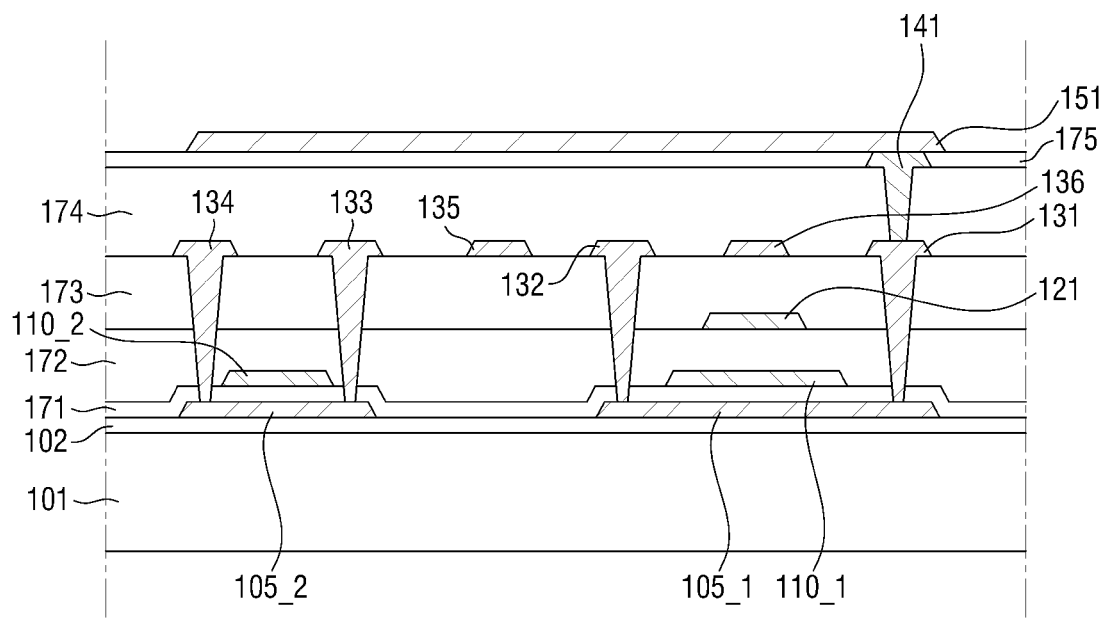

Referring to FIG. 11, an anode electrode 151 is formed on the fifth insulating layer 175. The anode electrode 151 may be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like.

Since the anode electrode 151 may be in direct contact with the first connection electrode 141, a separate contact hole forming process may be omitted. Therefore, a number of masks otherwise associated with providing a contact hole to enable contact between the first connection electrode 141 and the anode electrode 151 may be reduced. Thus, a cost and complexity of a manufacturing process may likewise be reduced.

Since the anode electrode 151 may be deposited on the planarized surface of the first connection electrode 141 and the fifth insulating layer 175, the anode electrode 151 may be formed with a uniform thickness, thereby further improving the display quality of an image to be displayed.

Figure 12:
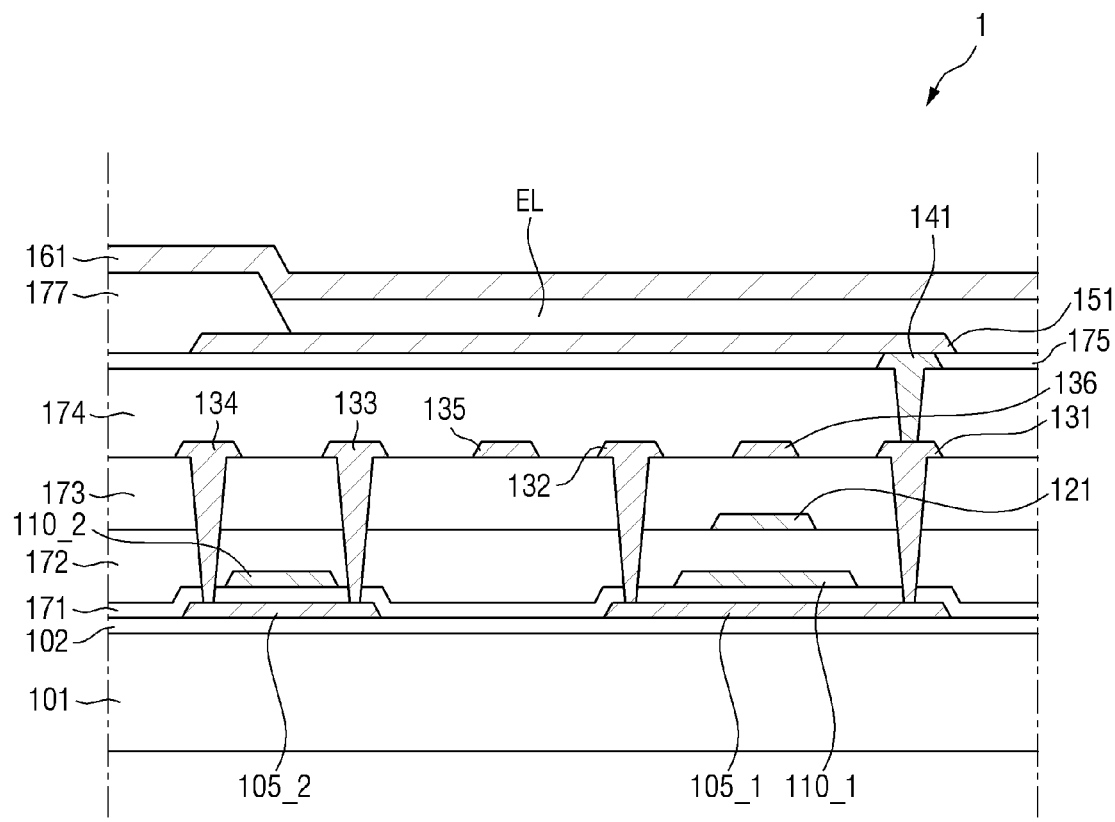

Referring to FIG. 12, a pixel defining layer 177, an organic light emitting layer EL and a cathode electrode 161 may be formed on the anode electrode 151 to complete a display device such as that shown in FIG. 3.

The pixel defining layer 177 may be formed so as to partially cover the anode electrode 151, and thus to partition the pixels PX. The pixel defining layer 177 may be formed by forming an organic layer containing at least one organic material selected from the group consisting of benzocyclobutene (BCB), polyimide (PI), polyamide (PA), acrylic resin and phenol resin, and then patterning the organic layer through an exposure and development process.

The cathode electrode 161 may be formed of a transparent conductive material (TCO) such as ITO or IZO that can transmit light or a semi-transmissive conductive material such as magnesium (Mg), silver (Ag), or an alloy of Mg and Ag.

As described above, the method of manufacturing a display device may enable the anode electrode 151 and the first connection electrode 141 to be in direct contact with each other. As a result, a separate contact hole forming process otherwise allowing for such direct contact may be omitted. Therefore, a cost and complexity of a manufacturing process may each be reduced.

While the invention has been illustrated and described with reference to the embodiments thereof, it will be apparent to those of ordinary skill in the art that various changes in form and detail may be formed thereto without departing from the spirit and scope of the disclosure and the following claims.

What is claimed is:

1. A display device, comprising:
   a substrate;
   a first conductive layer disposed on the substrate;
   a first insulating layer disposed on the first conductive layer, the first insulating layer including a contact hole exposing the first conductive layer;
   a second conductive layer disposed in the contact hole and on the first insulating layer such that a button surface of the second conductive layer that faces the substrate overlaps the first insulating layer in plain view, the second conductive layer being electrically connected to the first conductive layer through the contact hole;
   a second insulating layer disposed on the first insulating layer;
   a first electrode disposed on the second insulating layer and the second conductive layer, the first electrode being electrically connected to the second conductive layer;
   a light emitting layer disposed on the first electrode; and
   a second electrode disposed on the light emitting layer, wherein
   an average distance between an upper surface of the second conductive layer and a surface of the substrate is substantially equal to an average distance between an upper surface of the second insulating layer and the surface of the substrate.

2. The display device of claim 1, wherein the upper surface of the second insulating layer is coplanar with the upper surface of the second conductive layer.

3. The display device of claim 2, wherein the second insulating layer is disposed around the second conductive layer, and a sidewall of the second conductive layer contacts a sidewall of the second insulating layer.

4. The display device of claim 3, wherein
   an angle between the sidewall of the second conductive layer and a lower surface of the second conductive layer is an acute angle, and
   an angle between the sidewall of the second insulating layer and a lower surface of the second insulating layer is an obtuse angle.

5. The display device of claim 1, wherein the first electrode and the second conductive layer are in direct contact with each other.

6. The display device of claim 5, wherein the first electrode has a uniform thickness.

7. The display device of claim 6, further comprising a semiconductor layer disposed between the substrate and the first conductive layer, wherein the first conductive layer includes a first source electrode electrically connected to the semiconductor layer.

8. The display device of claim 1, further comprising a pixel defining layer disposed on the second insulating layer and the first electrode, the pixel defining layer including an opening exposing the first electrode.

9. The display device of claim 8, wherein the opening is disposed to overlap a region where the first electrode and the second conductive layer are electrically connected with each other.

10. The display device of claim 1, wherein the second insulating layer includes an organic insulating material.

11. The display device of claim 1, wherein a thickness of a portion of the second conductive layer disposed on the first insulating layer is the same as a thickness of the second insulating layer.

12. The display device of claim 11, wherein a thickness of the second insulating layer is smaller than a thickness of the first insulating layer.

13. The display device of claim 11, wherein
the substrate includes a display area and a non-display area, and
the display device further comprises a plurality of data lines disposed over the display area and the non-display area and a plurality of connection lines disposed in the display area, the plurality of connection lines being respectively connected to the plurality of data lines.

14. The display device of claim 13, further comprising a third conductive layer disposed on the first conductive layer and the second conductive layer, wherein
the second conductive layer includes the connection lines, and the first conductive layer includes the data lines.

15. The display device of claim 14, further comprising a third insulating layer disposed between the first electrode and the second insulating layer, wherein
an average distance between an upper surface of the third conductive layer and the surface of the substrate is substantially equal to an average distance between an upper surface of the third insulating layer and the surface of the substrate.

16. The display device of claim 15, wherein the third insulating layer includes an organic insulating material.

17. The display device of claim 15, wherein the second conductive layer and the third conductive layer are in direct contact with each other.

18. The display device of claim 17, wherein the third conductive layer has a uniform thickness.

19. The display device of claim 17, wherein the first conductive layer, the second conductive layer and the third conductive layer are disposed to overlap each other.

20. The display device of claim 1, wherein
the second conductive layer is directly connected to the first conductive layer; and
the second conductive layer is directly connected to a top surface of the first insulating layer at a location spaced apart from the first contact hole, and
a planar area of a bottom surface of the first electrode directly contacts both the second conductive layer and the second insulating layer.

21. A display device, comprising:
a substrate;
a first conductive layer disposed on the substrate;
a first insulating layer disposed on the first conductive layer, the first insulating layer including a contact hole exposing the first conductive layer;
a second conductive layer disposed in the contact hole and on the first insulating layer, the second conductive layer being electrically connected to the first conductive layer through the contact hole;
a second insulating layer disposed on the first insulating layer;
a first electrode disposed on the second insulating layer and the second conductive layer, the first electrode being electrically connected to the second conductive layer;
a light emitting layer disposed on the first electrode; and
a second electrode disposed on the light emitting layer, wherein
an average distance between an upper surface of the second conductive layer and a surface of the substrate is substantially equal to an average distance between an upper surface of the second insulating layer and the surface of the substrate, and
a surface roughness of the upper surface of the second insulating layer is larger than a surface roughness of an upper surface of the first insulating layer.

22. A display device, comprising:
a substrate;
a transistor comprising a semiconductor layer and a gate electrode on the substrate;
a first conductive layer disposed on both the semiconductor layer and extending through a contact hole in a second insulative layer such that a bottom surface of the first conductive layer that faces the substrate overlaps the second insulation layer in plain view, the first conductive layer being electrically connected to an end of the semiconductor layer;
a first insulating layer disposed at least partially on a same layer as the first conductive layer;
a first electrode disposed on the first conductive layer and the first insulating layer;
a light emitting layer disposed on the first electrode; and
a second electrode disposed on the light emitting layer, wherein
a planar area of a bottom surface of the first electrode directly contacts both the first conductive layer and the first insulating layer.

23. The display device of claim 22, wherein an upper surface of the first conductive layer is substantially coplanar with an upper surface of the first insulating layer.

24. The display device of claim 22, wherein a lower surface of the first electrode directly contacts an upper surface of the first conductive layer and an upper surface of the first insulating layer.

25. The display device of claim 24, wherein an average distance from the lower surface to an upper surface of the first electrode is substantially uniform.

26. The display device of claim 22, wherein the first conductive layer and the first insulating layer make direct contact with a top surface of the same layer.

* * * * *